(12) United States Patent
Chen et al.

(10) Patent No.: US 6,415,366 B1
(45) Date of Patent: Jul. 2, 2002

(54) METHOD AND APPARATUS FOR LOAD DISTRIBUTION ACROSS MEMORY BANKS WITH CONSTRAINED ACCESS

(75) Inventors: Jason Chung-Shih Chen, Ottawa; Paul M. Ruffle; Albert D. Heller, both of Kanata, all of (CA)

(73) Assignee: Alcatel Canada Inc., Kanata (CA)

( * ) Notice: Subject to any disclaimer, the term of this patent is extended or adjusted under 35 U.S.C. 154(b) by 0 days.

(21) Appl. No.: 09/324,207

(22) Filed: Jun. 2, 1999

(51) Int. Cl.$^7$ ............................................... G06F 12/00
(52) U.S. Cl. ......................... 711/158; 711/156; 711/5; 709/107; 709/103
(58) Field of Search ............................. 711/158, 5, 156, 711/151, 219; 709/107, 102, 103, 104, 105

(56) References Cited

U.S. PATENT DOCUMENTS 4,590,586 A * 5/1986 Zenk et al. .................. 711/151
5,432,920 A * 7/1995 Yazawa et al. .............. 710/112

* cited by examiner

*Primary Examiner*—Matthew Kim
*Assistant Examiner*—Matthew D. Anderson (57) ABSTRACT

A method and apparatus for load distribution across memory banks with constrained access is accomplished using a bank balancer that ensures that data to be buffered is evenly distributed throughout the various banks of the memory structure. The bank balancer maintains bank depth information relating to each of the banks. The bank balancer receives dequeue and enqueue information, where the dequeue information specifies read operations that will remove data from the various banks, and the enqueue information indicates that there is data to be written to the memory banks. The dequeue information constrains which banks may be utilized to enqueue received data. In order to determine to which banks to enqueue data, the bank balancer sorts the banks by their depth. The bank balancer then eliminates those banks which cannot be used for enqueue operations due to either the dequeue operations or other enqueue operations that have already been determined. Once a sorted list of eligible banks for enqueuing has been established, the bank balancer selects the bank storing the least amount of data which is eligible. The depth information for each bank is updated based on the enqueue and dequeue operations, and the bank balancer re-sorts the banks such that the changes in depth are taken into account in the following cell period.

25 Claims, 7 Drawing Sheets

METHOD AND APPARATUS FOR LOAD DISTRIBUTION ACROSS MEMORY BANKS WITH CONSTRAINED ACCESS

TECHNICAL FIELD OF THE INVENTION

The invention relates generally to buffering of data in a multi-bank memory and more particularly to a method and apparatus for buffering data cells in a multi-bank memory within a communication switch.

BACKGROUND OF THE INVENTION

A communication network is used to transport data between various parties connected to the network. Cell-based and packet-based networks typically include a number of switches that can receive data from a number of different sources and deliver it to a number of different destinations. These switches are intercoupled such that data can be transmitted throughout the network. In order to allow data to be received from a plurality of sources and delivered to a plurality of different outputs, buffering capabilities are typically included within these switches.

The output buffer of a typical packet- or cell-based switch includes buffering memory that stores received data cells or packets prior to delivering the cells or packets to the various outputs of the switch. In many cases, the buffering memory utilized within these output buffers includes a number of banks. The interaction between the various banks in the memory can place some constraints on the types of memory operations that can be executed. For example, if a bank is read from during a memory cycle, it cannot be written to during the same cycle. Various memory constraints can exist within different memory systems.

In order to maximize the usage of the buffering memory, it is important to ensure that if there is remaining space in the buffering memory, it can be utilized for write operations. This may be difficult if a number of the memory banks have been filled, and read operations are directed towards the unfilled banks. When this scenario occurs, the write operations are unable to access the banks that are not filled due to the fact that the read operations are being performed. Typically, the read operations, which dequeue data cells or packets from the buffering structure for output are controlled external to the circuitry performing the actual buffering. As such, the control of which data is dequeued is outside of the memory management circuitry.

Therefore, a need exists for a method and apparatus that allows for maximum usage of multi-bank buffering memory such that when space is available within the buffering memory, it can be accessed even though memory operations are constrained based on fixed dequeuing operations.

DETAILED DESCRIPTION OF A PREFERRED EMBODIMENT OF THE INVENTION

Generally, the present invention provides a method and apparatus for load distribution across memory banks with constrained access. This is accomplished using a bank balancer that ensures that data to be buffered is evenly distributed throughout the various banks of the memory structure. In order to accomplish this, the bank balancer maintains bank depth information for each of the banks. The bank balancer receives dequeue and enqueue information, where the dequeue information indicates read operations that will remove data from the various banks, and the enqueue information indicates that there is data to be written to the memory banks. The dequeue information constrains which banks may be utilized to enqueue received data. In order to determine to which banks to enqueue data, the bank balancer sorts the banks by their depth. The bank balancer eliminates from the list those banks which cannot be used for enqueue operations due to the dequeue operations or other enqueue operations that have already been determined. Once a sorted list of eligible banks for enqueuing has been established, the bank balancer selects the bank storing the least amount of data that is eligible. Once the enqueue and dequeue banks have been determined for an entire memory cycle, or cell period, the bank balancer increments and decrements the physical bank depths corresponding to those banks utilized for enqueuing or dequeuing. The bank balancer then re-sorts the banks such that the change in depth due to the most recent set of memory operations is taken into account during the following cell period.

By maintaining bank depth counts for each of the banks, the bank balancer can evenly distribute data to be enqueued such that no bank is filled to capacity while other banks are far from their capacity. As such, when data to be enqueued is received and the banks to which the enqueuing can be performed are constrained by dequeuing operations, it is more likely that one of the banks which is not constrained will have space remaining for the enqueuing operations. As such, the overall usage of the buffering memory resources is improved orver techniques that didn't ensure the even load distribution amongst the banks. This helps reduce costs, as additional memory does not have to be included in the system to maintain an expected memory usage level.

Figure 1:
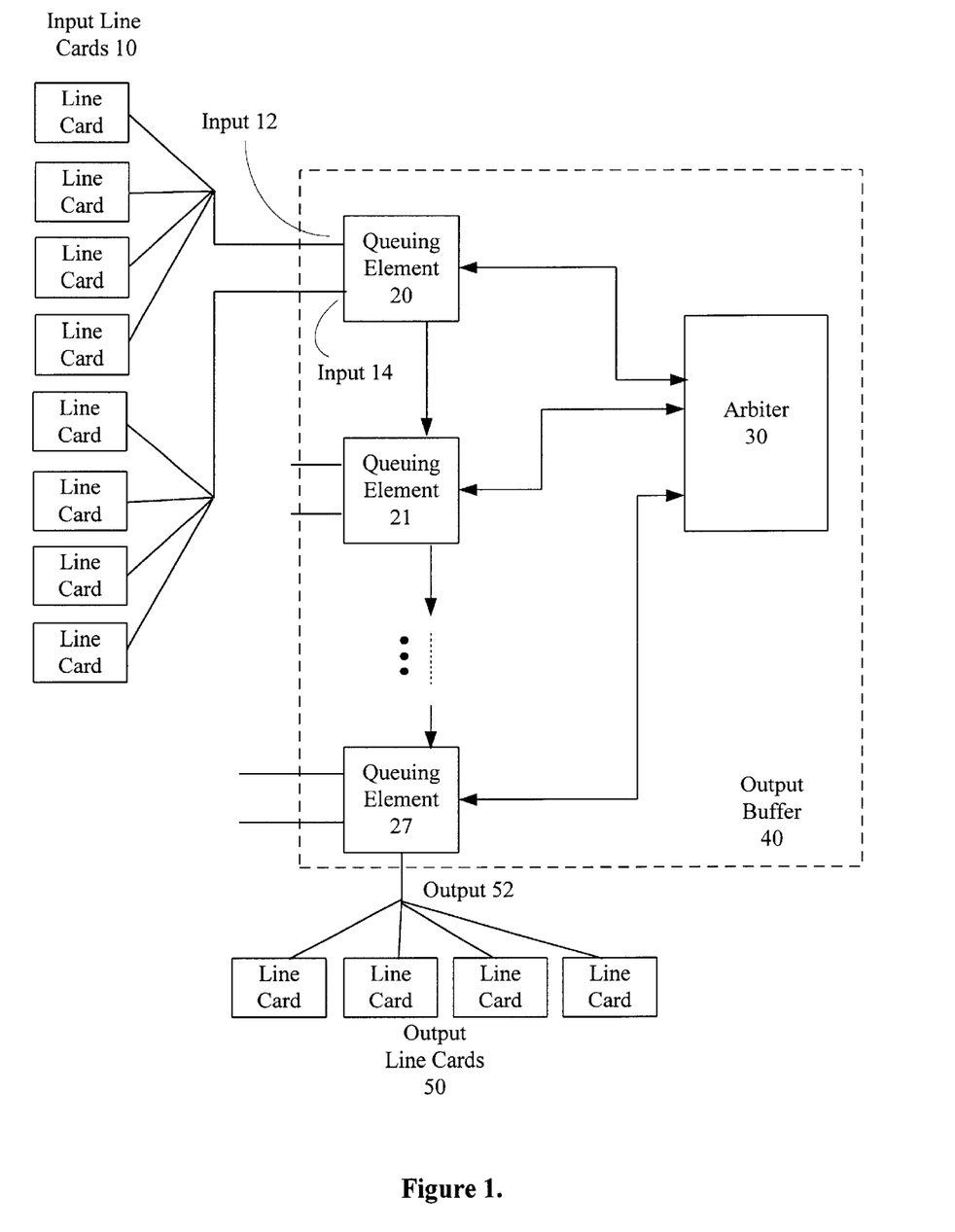
FIG. 1 illustrates a block diagram of an output buffer in accordance with the present invention.

The invention can be better understood with reference to FIGS. 1–7. FIG. 1 illustrates the output buffer 40 of a communication switch. Preferably, the output buffer 40 is included in a packet-based or cell-based switch that includes a plurality of such output buffers, where each output buffer corresponds to a set of output line cards. In one embodiment, the output buffer 40 is utilized in an ATM switch in a communications network.

The output buffer 40 includes a plurality of queuing elements 20–27. Each queuing element, such as queuing element 20, receives inputs over one or more inputs 12 and 14 from a plurality of input line cards 10. The data received from these input line cards 10 is buffered prior to being included in a data stream that eventually becomes the output 52. This output 52 is then provided to a plurality of output line cards 50.

The intercoupling of the plurality of queuing elements 20–27 within the output buffer is arbitrary, however, a preferred intercoupling technique is described in a co-pending patent application entitled "Method and Apparatus for High Bandwidth Multi-Source Interconnection Using Point-to-Point Buses", filed on Mar. 24, 1999, and having a Ser. No. of 09/275,677. Similarly, the technique for monitoring and controlling the received data and dequeuing data to form the output data stream is discussed in another co-pending application entitled "Method and Apparatus for Data Buffer Management in a Communication Switch", filed Mar. 26, 1999, and having a Ser. No. of 09/277,361

Each of the queuing elements 20–27 includes buffer memory that is used to buffer the received data prior to including it in the output data stream. Preferably, the queuing elements are implemented as Application Specific Integrated Circuits (ASICs), and therefore reducing the buffer memory requirements begets reduced ASIC costs. The arbiter 30 of the output buffer 40 controls when data within each queuing element is dequeued, or included in the output data stream. In one embodiment, the arbiter 30 can dequeue up to four data cells in a single cell period, which may be referred to herein as a memory cycle. During the same cell period in this embodiment, up to eight sets of input data, or cells, may be received from the input line cards 10. where the data received must be enqueued. Thus, in this embodiment, up to four read operations and eight write operations may be performed within a single cell period.

The buffering memory included in the system may be of many different forms including dynamic random access memory (DRAM), static random access memory (SRAM), etc. Preferably, the buffering memory is DRAM that includes a plurality of separate banks. The cell period, or memory cycle, of the memory is preferably divided into a number of different time slots. In one embodiment, when a read occurs to a specific bank within the DRAM memory during a time slot, writing to that bank during the same time slot cannot occur. In another embodiment, the memory includes 16 physical banks, and due to the circuitry of the memory structure, a read or other memory access to a bank within a time slot disables the bank accessed as well as the neighboring banks from getting accessed again during that time slot.

Although the various constraints placed on usage of the banks within different memory structures will vary, the basic principles and methodology described herein are applicable to any type of multi-bank memory structure. Therefore, it should be understood that the specific embodiments described herein should not be interpreted as to limit the invention, but rather should be understood to depict the advantages and application of the invention to specific memory structures.

Figure 2:
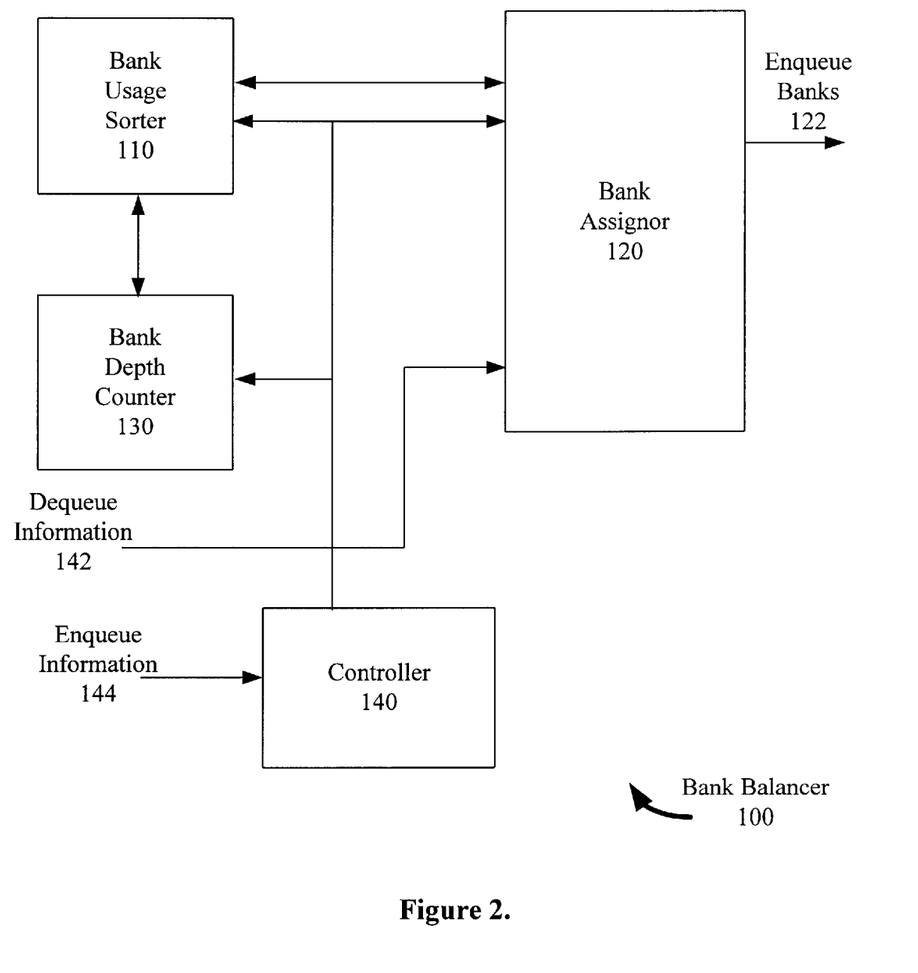
FIG. 2 illustrates a block diagram of a bank balancer in accordance with the present invention.

FIG. 2 illustrates a bank balancer 100 that includes a bank usage sorter 110, a bank depth counter block 130, a bank assignor 120, and a controller 140. The bank depth counter block 130 monitors the usage of the various banks within the memory. As such, the bank depth counter may include a plurality of counters, where each of the plurality of counters corresponds to one of the banks within the memory. When data is stored in a bank, the counter corresponding to that bank is incremented to reflect that the depth of data in the bank has been increased. Similarly, when data has been read from the bank such that the data is no longer useful, the bank depth counter for that bank is decremented to reflect that the depth of data has been reduced. It should be noted that in some cases data stored in a bank may be provided to more than one output of the output buffer. As such, the bank depth counter may not be decremented for each read operation, but only decremented when the particular data set has been read for all of the outputs to which it is to be provided.

The bank usage sorter 110 is operably coupled to the bank depth counter block 130. The bank usage sorter 110 produces an ordered list of representations corresponding to the plurality of banks. The representations, which may be binary encoded numbers corresponding to the banls, are ordered based on the depth of each bank of the plurality of banks. Thus, the bank usage sorter 110 preferably orders the representations of the banks in the ordered list in an increasing depth order such that those storing the least amount of data are at the top of the list. It should be noted that the depth of the banks may be maintained in software or other forms of registers rather than being maintained in counters.

The bank assignor 120 is operably coupled to the bank usage sorter 110, and includes one or more bank assignment blocks. Each bank assignment block receives and indication of ineligible banks for a memory operation. The ineligible banks for a memory operation may include the identity of banks which are to be utilized for a read operation during the particular time slot for which the bank assignment block is to determine a bank to be used for a write operation. The banks for such read operations are preferably included in the dequeuing information 142. If more than one write operation occurs within a time slot, the ineligible banks may also include another bank that is to be used for a write operation, where the identity of the other bank has already been determined. In other embodiments, the ineligible banks may include banks that are accessed in neighboring time slots, or banks adjacent to those banks accessed in neighboring time slots.

In addition to the ineligible banks, each bank assignment block receives the ordered list of banks from the bank usage sorter 110. Based on this received information, each bank assignment block selects a first eligible bank from the ordered list for a memory operation, which is preferably an enqueuing write operation. If the ordered list lists the banks in an increasing order according to depth such that those having the lowest depth are on the top of the list, the bank assignment block may disregard ineligible blocks and select the first eligible bank from the top of the ordered list. In order to disregard ineligible banks, a flag within the ordered list maybe set corresponding to ineligible banks such that these banks are overlooked in the selection process. Preferably, the flag is implemented as a single bit that indicates eligibility/ineligibility.

The bank assignor may include a plurality of bank assignment blocks. Each bank assignment block selects a selected bank for a corresponding memory operation to be performed in a time slot, where each bank assignment block corresponds to a different memory operation. In an example system where a memory cycle or cell cycle is divided into four time slots, and two write operations are to be performed in each time slot, eight bank assignment blocks will be included in the bank assignor. One bank assignment block is responsible for determining the appropriate bank for each of the different write operation. Each of these bank assignment blocks will receive an indication of ineligible banks, where the ineligible banks for different time slots within the cell cycle will differ based on the dequeuing operation to be performed within that cell slot, and any other enqueuing operation to be performed within that cell slot. Regardless of which banks are ineligible, the bank assignment block merely selects the first eligible bank from the ordered list received from the bank usage sorter 110, while disregarding any ineligible banks in the selection process. The banks selected by the bank assignment blocks are provided as the enqueue banks output 122 of the bank assignor 120.

The controller 140 receives the dequeuing information 142, which indicates the identities of the banks from which data is to be read. The controller 140 also receives enqueuing information 144 that indicates the number of data cells to be enqueued, which in the example embodiment can vary from 0 to 8. The controller 140 provides control signals to the various other blocks in the bank balancer 100 to control the overall operation of the bank balancer 100. Preferably, the controller 140 is a finite state machine, where implementing control systems through the use of finite station machines is well understood in the art.

Figure 3:
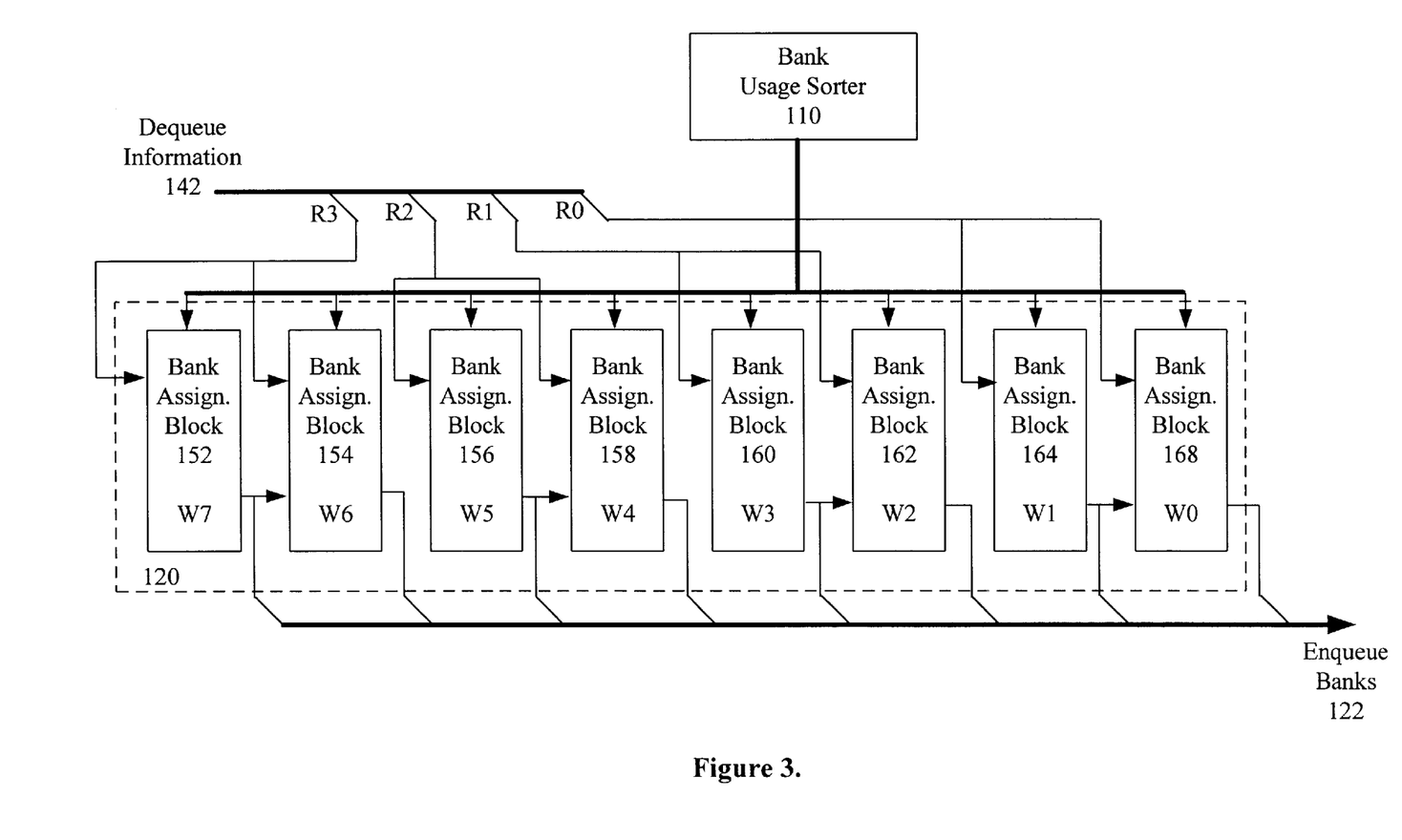
FIG. 3 illustrates a block diagram of a bank assignor in accordance with the present invention.

FIG. 3 illustrates a more detailed view of a bank assignor 120 used in a preferred embodiment of the invention. As is illustrated, the bank assignor 120 receives the sorted list from the bank usage sorter 110 and the dequeuing information 142 that identifies the banks from which data will be read. In response to the input received, the bank assignor 120 will produce the enqueue banks 122, which are used to enqueue received data. The bank assignor 120 illustrated in FIG. 3 is designed for use in a four-bank memory where the cell period is divided up into at least four time slots. The bank assignor 120 includes eight bank assignment blocks 152–168. Each bank assignment block is responsible for returning the identity of a single bank for use in one of eight write operations which may be performed within a cell period. Because the cell period for the implementation shown is divided into at least four time slots, two write operations may be performed within each time slot. Thus, the bank assignment blocks 152–168 are divided into four bank assignment block pairs. Each bank assignment block determines the appropriate bank for one enqueuing operation, identified as W7-W0. The dequeuing operations are illustrated R3-R0.

Each bank assignment pair corresponds to one time slot in a memory cycle. Thus, the bank assignment block pair that includes bank assignment blocks 152 and 154 may be utilized to determine the banks to use for the write operations to be performed in the first time slot of the cell period. The bank assignment block 152 receives the ordered list from the bank usage sorter 110 and an indication of the ineligible banks that cannot be considered in determining the first bank to be used for the first write operation. In this case, the only bank which is ineligible corresponds to the bank to be utilized for a dequeuing operation in the first time slot (R3). The bank assignment block 152 will eliminate the bank indicated by R3 and select the next eligible bank in the ordered list as the first selected bank for the first write operation.

The ineligible banks corresponding to the bank assignment block 154 include both the bank utilized for the first read 145 and the first selected bank for the first write operation as selected by the bank assignment block 152. Thus, the bank assignment block 154 will perform its selection after it has received an indication from the bank assignment block 152 as to which bank is to be used for the first write operation. In this embodiment a bank cannot be utilized twice in one time slot for performing read or write operations. As such, the bank assignment block 154 must take into consideration that both the bank utilized for the read operation and the bank utilized for the other write operation within that time slot are ineligible for selection as the second selected bank for the second write operation.

Each of the other bank assignment block pairs is able to operate without regard to the read and operations performed in the other time slots. Note that this is specific to the memory structure of this example embodiment, and in other embodiments neighboring time slots may effect each other.

Figure 4:
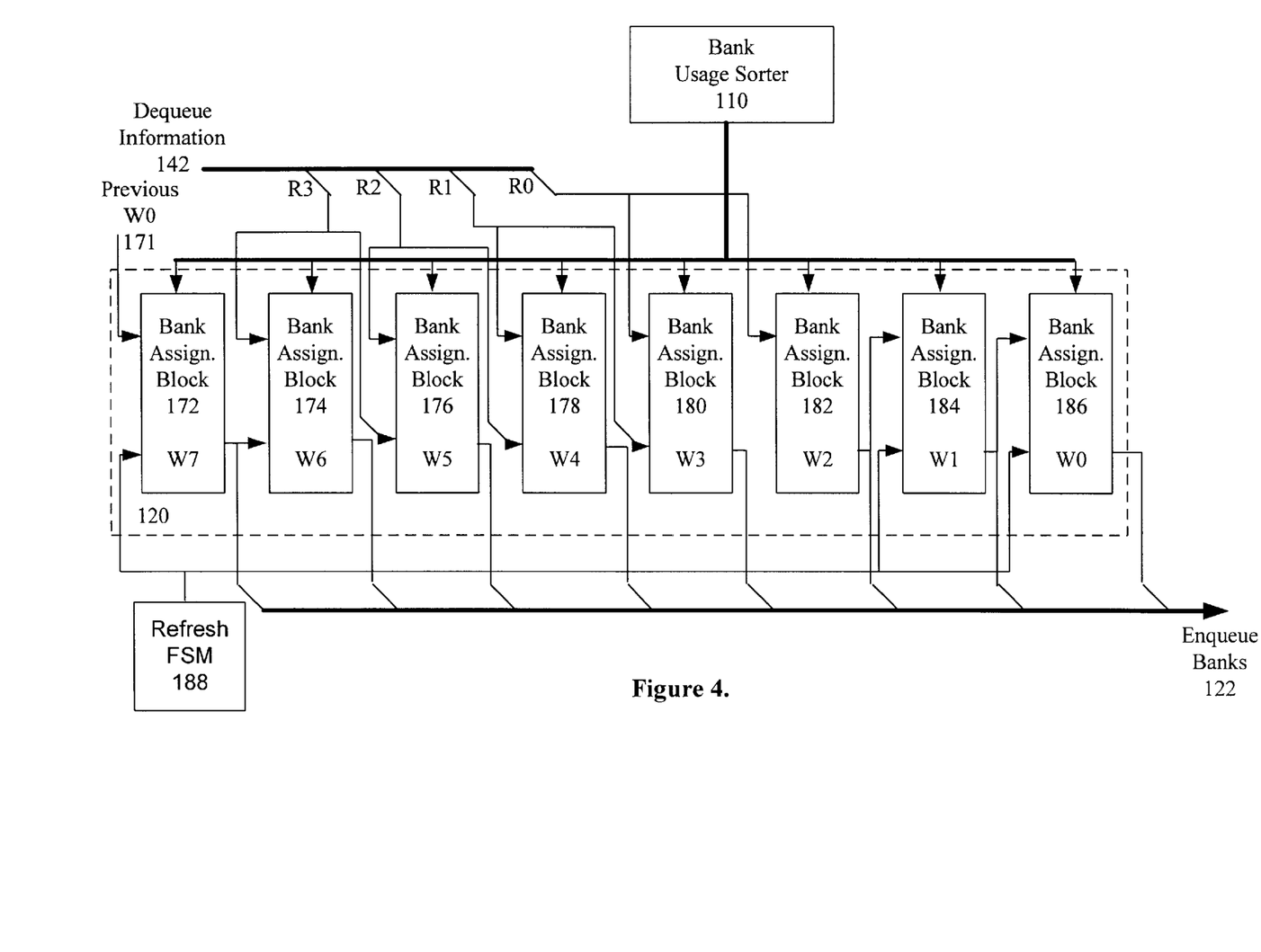
FIG. 4 illustrates a block diagram of another bank assignor in accordance with the present invention.

FIG. 4 illustrates another bank assignor 120 that may be utilized with a different memory structure. The memory structure for which the bank assignor 120 is applicable maybe a 16-bank DRAM designed by Rambus, Inc. of Mountain View, Calif. The memory structure for which the bank assignor 120 of FIG. 4 is applicable has more limitations on neighboring accesses within the cell period. As such, there is more interdependency between bank assignment blocks within the bank assignor 120.

As is illustrated, the bank assignment block 120 includes a plurality of bank assignment blocks 172–186. Each of the bank assignment blocks 172–186 receives the sorted list from the bank usage sorter 110. In addition to this, each bank assignment block receives an indication as to ineligible banks for its particular time slot. These ineligible banks may include read operations performed in neighboring time slots, and also may include write operations performed in neighboring time slots. In addition to these ineligible banks, in DRAM structures, refresh operations are required to ensure maintenance of valid data in the memory structure. These refresh operations will further constrain bank accesses in a cell period. As such, some of the bank assignment blocks receive an indication from the refresh finite state machine 188 as to the bank or banks that are being refreshed. These banks are also considered as ineligible in the bank selection processor performed by these bank assignment blocks.

Because neighboring time slots effect each other in the implementation illustrated in FIG. 4, the first time slot of a cell period must take into account what occurred in the last time slot of the previous cell period. Thus, the bank assignment block 172 will receive some indication as to the bank selected by the bank assignment block 186 in the previous cell period.

The Rambus DRAM memory structure is structured such that when a memory operation occurs within one bank, the bank itself and its neighboring banks are all rendered ineligible for additional memory operations in neighboring time slots. Thus, when a bank assignment block is preparing to determine a bank for a memory operation, it must eliminate from the sorted list both ineligible banks and neighbors to those banks.

In order to implement eight write operations in addition to the four read operations, or dequeuing operations, in a cell cycle, the optimal pattern for use with the Rambus memory is W7, W6, R3, W5, R2, W4, R1, W3, R0, W2, W1, W0, Rf. In this list, the Wn represents a write operation, where n varies from 0–7 for the eight write operations. Similarly, Rn indicates a read operation where n varies from 0–3 for the four read operations. The Rf represents the refresh cycle, which is preferably placed at the end of the cell period. The figure illustrates the interconnections required for each of the bank assignment blocks to determine the appropriate bank for data storage within its time slot.

For example, the bank assignment block 174, which determines the bank corresponding to one of the write operations (W6) takes into account the neighboring time slots. One of which is used to perform the R3 read operation, which is fixed and not selectable. The other operation is the W7 write operation, the bank for which is determined by the bank assignment block 172. The bank assignment block 174 receives the bank for the R3 operation and the bank for the W7 operation and eliminates these banks from the ordered list of eligible banks from which it can choose. In addition to eliminating these banks, the bank assignment block 174 eliminates the banks that neighbor the banks for the R3 and W7 operations. The banks remaining in the list are then examined to select the bank to be utilized for the W6 operation. Preferably, the ordered list is structured such that selecting the appropriate bank is as simple as choosing the top, or first eligible bank in the list.

Once again, it should be stressed that the bank assignors illustrated in FIGS. 3 and 4 are for specific memory structures having specific constraints on memory accesses. Thus, it should be apparent to one of ordinary skill in the art that an appropriate bank assignor can be implemented based on the general methodology described herein to suit the needs of memory structures that include other constraints.

Figure 5:
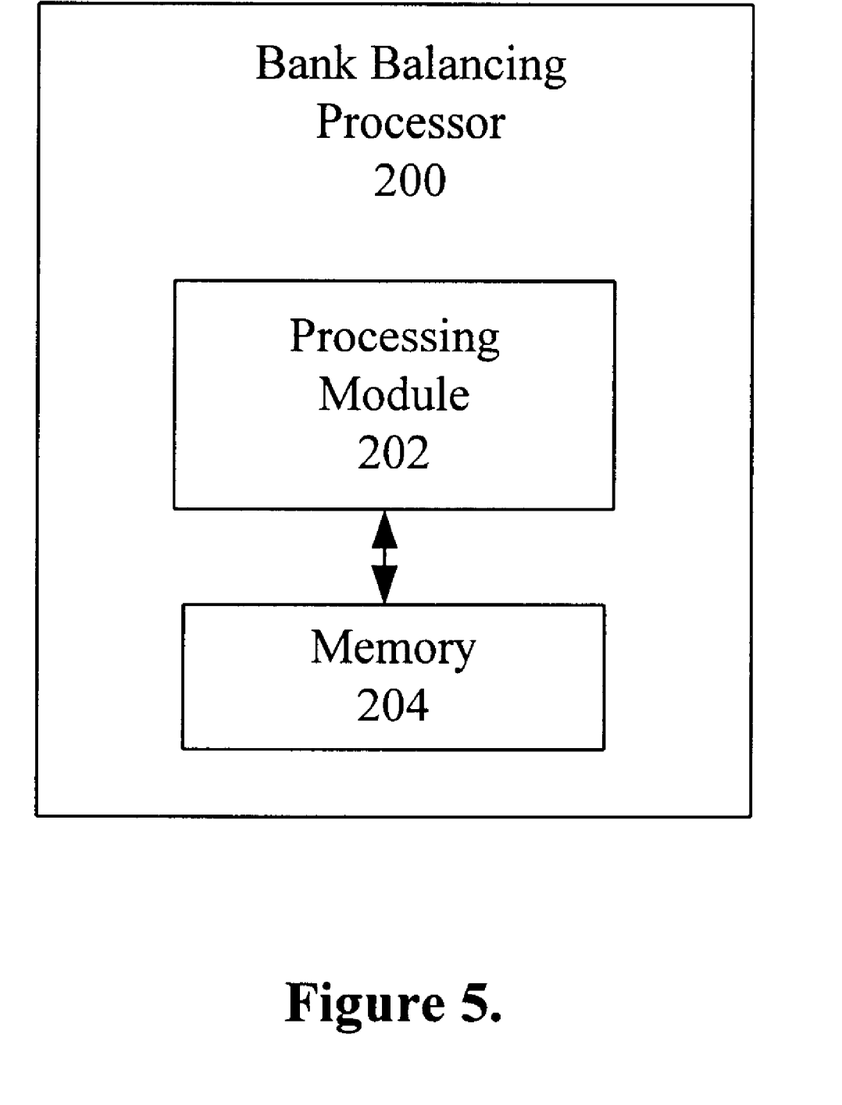
FIG. 5 illustrates a block diagram of a bank balancing processor in accordance with the present invention.
Figure 6:
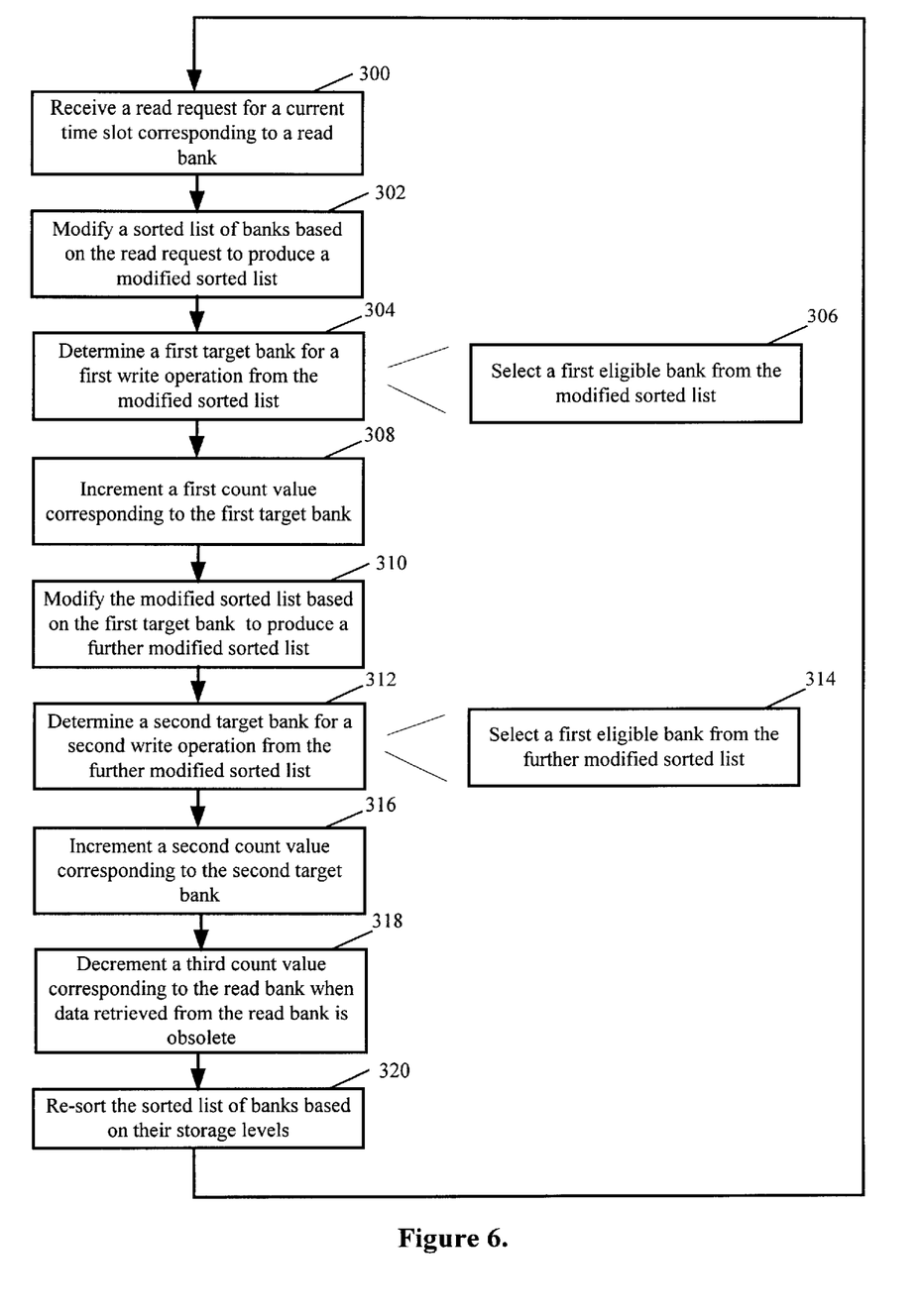
FIG. 6 illustrates a flow diagram of a method for memory bank management in accordance with the present invention.
Figure 7:
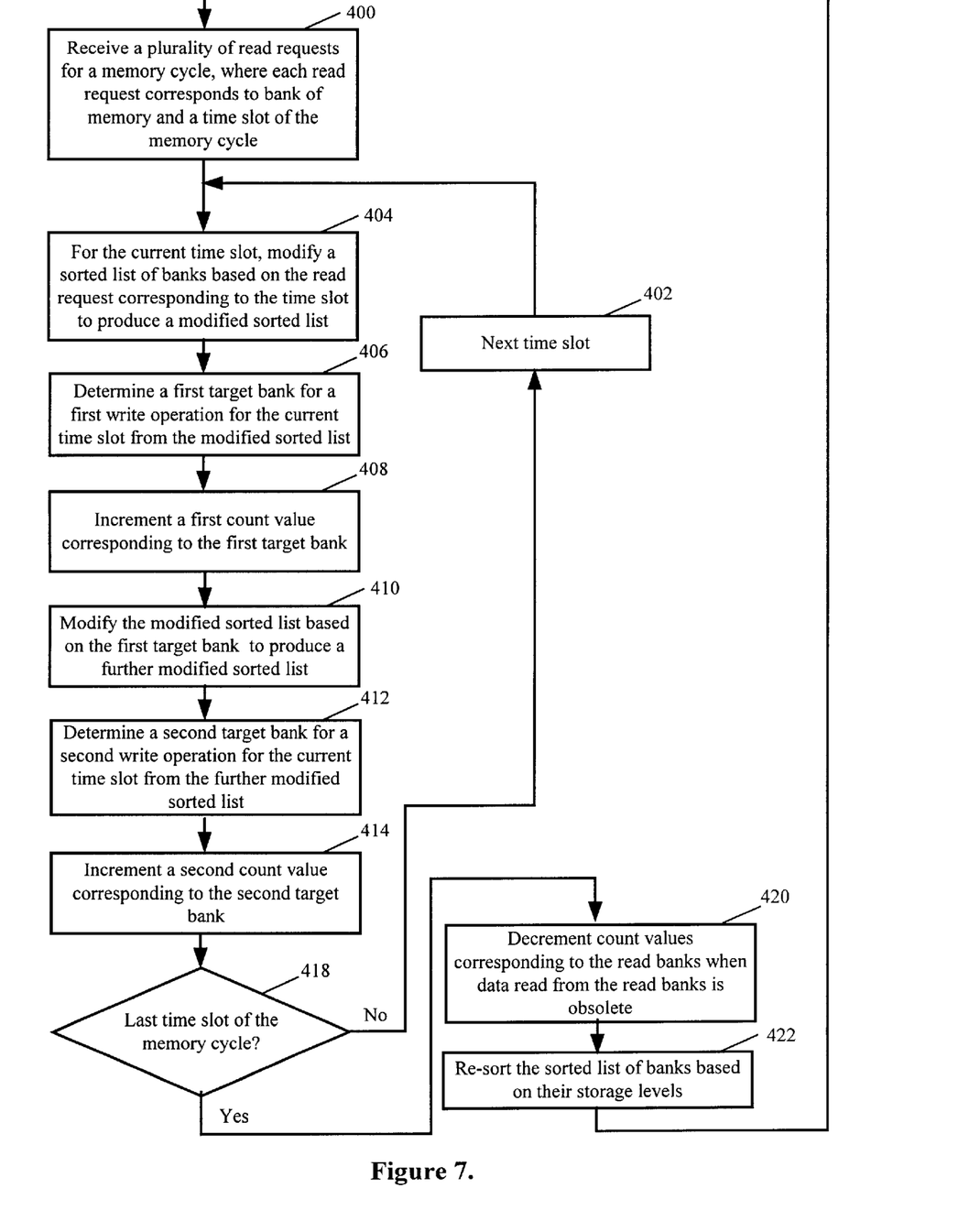
FIG. 7 illustrates a flow diagram of another method for memory bank management in accordance with the present invention.

FIG. 5 illustrates a bank balancing processor 200 that may be utilized to perform the methods illustrated in FIGS. 6 and 7 such that memory usage is maximized in a constrained access memory buffer. The bank balancing processor 200 includes a processing module 202 that is operably coupled to an instruction memory 204. The processing module 202 may include a single processing entity or a plurality of processing entities. Such a processing entity may be a microprocessor, microcontroller, digital signal processor, state machine, logic circuitry, and/or any device that processes information based on operation and/or programming instructions.

The instruction memory 204 may be a single memory device or a plurality of memory devices. Such a memory device may be a read-only memory device, random access memory device, floppy disk, hard drive memory, and/or any device that stores digital information. Note that the processing module 202 may have one or more of its functions performed by a state machine and/or some combination of logic circuitry. In such an instance, the instruction memory 204 is effectively embedded within the state machine and/or logic circuitry such that a physically separate memory device may not be present. The instruction memory 204 stores programming and/or operation instructions that allow the processing module 202 to perform the methods illustrated in FIGS. 6 and 7 corresponding to memory bank management.

FIG. 6 illustrates a first method for memory bank management that begins at step 300. At step 300, a read request for a current time slot is received. The read request corresponds to data stored in a read bank of a memory, where the memory includes a plurality of banks. Preferably, the memory is a DRAM memory structure. The read bank is a name attributed to the bank that contains the data to be read, and does not indicate that the bank is dedicated to read operations. The read bank in one cell period may be selected as a write bank in another cell period.

At step 302, a sorted list of banks is modified based on the read request to produce a modified sorted list. Preferably, the sorted list of banks sorts the banks by their current depth. Thus, banks that have more data stored in them are preferably toward the bottom of the list, where those having the most free space are located towards the top of the list. Modifying the sorted list preferably includes eliminating those banks that are ineligible for further memory operations in the current time slot. Thus, the bank utilized for the read operation is ineligible for further operations in the current time slot and is eliminated from the list. Elimination from the list may include flagging an entry in the list such that it is overlooked when the list is utilized to determine the appropriate bank for additional memory operations. In other embodiments, modifying the list may include eliminating not only the read bank, but also banks which neighbor the read bank. This is appropriate when the DRAM structure is a Rambus DRAM structure as was described with respect to FIG. 4.

At step 304, a first target bank for a first write operation is determined based on the modified sorted list. Preferably, the sorted list is ordered as was described earlier such that the top of the list represents those banks having the most space available. As such, determining the appropriate target bank may be as simple as step 306, where the first eligible bank in the modified list is selected.

At step 308, a first count value corresponding to the first target bank is incremented. The first count value indicates data storage level or depth of the first target bank. As the first target bank has been selected for a write operation, additional data is to be added to the first target bank. As such, its depth will increase to reflect the additional data storage. Note that this step may be performed at any point in time prior to the re-sorting that updates the sorted list.

If only one write bank must be determined per time slot, the method illustrated in FIG. 6 may now repeat such that the next read request is received for the next time slot and the associated write bank for that time slot is determined. However, the method illustrated in FIG. 6 is appropriate for a memory structure that allows for two write operations during a single time slot. As such, steps 310–316 are representative of the determination of a bank for the second write operation.

At step 310, the modified sorted list is further modified to produce a further modified sorted list that includes the first target bank as an ineligible bank. Thus, both the read bank and the first target bank are eliminated from the eligible banks included in further modified sorted list. At step 312, a second target bank for a second write operation is determined from the further modified sorted list. As before, this may be accomplished at step 314 by selecting the first eligible bank from the further modified sorted list.

At step 316, a second count value corresponding to the second target bank is incremented where the second count value indicates the data storage level of the second target bank. Once again, this count value is incremented because additional data is being placed in the second target bank, thus increasing its depth. In contrast, at step 318, a third count value corresponding to the read bank is decremented, where the third count value indicates a data storage level of the read bank. This count value is decremented to correspond to the fact that data has been removed from the read bank and its depth has effectively been reduced. As stated earlier, it is important to consider that some data may be read multiple times before it is rendered obsolete within a bank. As such, a flag or some other counting mechanism may be included in the data storage to indicate how many times the data has been read for output. Only when the data has been read a sufficient number of times is the data rendered obsolete, and then the count value is decremented to reflect the reduction in depth in that particular bank.

Once the count values corresponding to the banks that were accessed are updated, the sorted list of banks is re-sorted at step 320 to reflect the changed count values associated with each of the banks. Once again, ordering of the banks in the sorted list corresponds to the data storage levels, or depths of the banks. It should be noted that the granularity of the sort performed at step 320 may be less than the granularity of the count values. For example, the granularity of the sort may be based on tens of cells in the banks, whereas the actual count values reflect the exact number of cells within a bank.

It should also be noted that the re-sorting performed at step 320 may be performed at a time that is implementation dependent. In some applications, re-sorting may be practical at the end of each memory cycle, whereas in other applications it may be performed at the end of each time slot within a memory cycle. In yet other applications, it may occur after each bank assignment. Typically, the re-sorting, which is preferably a background processing step, will consume sufficient time and resources that an optimal placement of the re-sorting step is desired. Such a placement may be constrained by the timing constraints forced on the sort routine by other portions of the system. In the preferred embodiment, the optimal placement of this step coincides with the end of each memory cycle.

Once the sort has been performed at step 320, the method of FIG. 6 can be repeated. Note that this assumes that a sort is performed after each set of write banks has been determined. In other embodiments, multiple time slots having multiple write operations in each time slot may utilize the sorted list before a re-sort is performed. This can conserve processing resources and ensure that a sorted list is available at the correct time to be utilized to determine the banks for memory operations.

A method for memory bank management that includes multiple time slot iterations between bank depth sorts is illustrated in FIG. 7. At step 400, a plurality of read requests for a memory cycle, or cell period, is received. Each read request of the plurality of read requests corresponds to a bank of a memory buffer, where the memory buffer includes a plurality of banks. Each memory cycle, or cell period is divided into a plurality of time slots, where each of the plurality of read requests is assigned to one of the plurality of time slots.

Steps 402–418 represent a loop that is repeated for each time slot within the cell period. Thus, the loop will be repeated to select the appropriate write banks for each time slot within the cell period. At step 404, a sorted list of banks is modified based on the read request assigned to the time slot for which this iteration of the loop corresponds. The modification of the sorted list produces a modified sorted list that indicates that the bank corresponding to the read request assigned to the time slot is ineligible for further memory operations in the time slot. This is similar to step 302 of FIG. 6. At step 406, a first target bank for a first write operation corresponding to the time slot is determined based on the modified sorted list. This is similar to step 304 of FIG. 6, and preferably involves selecting the top or first eligible bank of the modified sorted list. At step 408, a count value corresponding to the first target bank is incremented to reflect the additional data storage in the first target bank. This is similar to step 308 of FIG. 6.

As was described with respect to FIG. 6, the loop for each time slot may end at this point if only one write operation is assigned to a particular time slot. However, the method illustrated in FIG. 7 is configured for two write operations per time slot. As such, at step 410, the modified sorted list is further modified to reflect that the first target bank is ineligible for an additional memory operation in the time slot. At step 412, a second target bank is determined for a second write operation from the further modified sorted list. At step 414, a count value corresponding to the second target bank is incremented.

At step 418, it is determined whether or not the target banks for the write operations in the last time slot of the cell period have been determined. If all of the target banks for the cell period have not been determined, the method proceeds back to step 402 where the method advances to the next time slot in the cell period. The iterative loop is then repeated for the next time slot. It should be noted that the sorted list of banks is returned to its original state prior to beginning the iterative loop. As such, the modification operations of steps 404 and 410 are irrelevant to the next iteration through the loop. This is because operations performed in neighboring time slots in this particular implementation are irrelevant to each other. In the Rambus memory operation, neighboring time slot operations are relevant to each other, and a different flow diagram would be appropriate.

Thus, the iterative loop is repeated for all of the time slots within the cell period. When all of the write target banks have been determined for all of the time slots, the method will proceed from step 418 to step 420. At step 420, the count values corresponding to the banks utilized by the plurality of read requests are decremented to reflect the reduction in depth of these banks. As described with respect to step 318 of FIG. 6, the decrementing of these count values may be dependent on whether or not the data read from the banks is obsolete, or if it will be read again in the future. Note that the decrementing function may be included in the iterative loop such that the bank that is read from in each time slot is decremented as the write target banks are determined. Once all of the write target banks have been determined for the cell period, they are provided to the circuitry which performs the actual read and write operations, and the method proceeds to step 422. At step 422, a new sorted list of banks is generated based on the new count values that have been updated to reflect the memory operations that occurred in the previous cell period. Thus, re-sorting of the banks to reflect their usage only occurs on a cell period-by-cell period basis, where each list is used for a plurality of time slot determinations.

By monitoring the usage of the various banks in the memory buffer and selecting the bank to which data is enqueued based on this usage, a balancing, or load distribution of data storage within the memory occurs. This balancing insures that no one memory bank will be filled while other memory banks are underutilized. This helps to ensure that a bank will be available for enqueuing data when other banks are rendered ineligible for enqueuing based on dequeuing and other enqueuing operations. This improves memory efficiency, and can help reduce cost in systems by reducing the amount of memory required to achieve an effective storage capacity.

It should be understood that the implementation of other variations and modifications of the invention in its various aspects should be apparent to those of ordinary skill in the art, and that the invention is not limited to the specific embodiments described. For examples additional criteria may be utilized in the selection process other than the depth of particular banks. In such an embodiment, in order minimize power consumption in the memory block, the usage of a particular bank in other time slots of a cell period may be taken into account to determine that it is more power efficient to re-utilize utilize these banks for write operations even though they have a greater depth of data storage than other banks which are not being utilized in a particular cell period. It is therefore contemplated to cover by the present invention, any and all modifications, variations, or equivalents that fall within the spirit and scope of the basic underlying principles disclosed and claimed herein.

What is claimed is:

1. A method for memory bank management, comprising:

receiving a read request for a current time slot, wherein the read request corresponds to a read bank of a memory, wherein the memory includes a plurality of banks;

modifying a sorted list of banks based on the read request to produce a modified sorted list, wherein the modified sorted list indicates that the read bank is ineligible for further memory operations in the current time slot;

determining a first target bank for a first write operation based on the modified sorted list;

incrementing a first count value corresponding to the first target bank, wherein the first count value indicates data storage level of the first target bank; and re-sorting the sorted list of banks, wherein ordering of the banks in the sorted list corresponds to data storage levels of the banks.

2. The method of claim 1 further comprises, prior to re-sorting:

modifying the modified sorted list to produce a further modified sorted list, wherein the further modified sorted list indicates that the first target bank is ineligible for further memory operations in the current time slot;

determining a second target bank for a second write operation from the further modified sorted list; and incrementing a second count value corresponding to the second target bank, wherein the second count value indicates data storage level of the second target bank.

3. The method of claim 2 further comprises, prior to re-sorting, decrementing a third count value corresponding to the read bank, wherein the third count value indicates data storage level of the read bank.

4. The method of claim 1, wherein modifying the sorted list of banks further comprises flagging the read bank in the sorted list, wherein flagging indicates that the read bank is ineligible for a write operation during the current time slot.

5. The method of claim 4, wherein flagging further comprises flagging the read bank and neighboring banks to the read bank.

6. The method of claim 1, wherein determining the first target bank further comprises selecting a first eligible bank in the modified sorted list.

7. A method for memory bank management, comprising:

receiving a plurality of read requests for a memory cycle, wherein each read request of the plurality of read requests corresponds to a bank of a memory, wherein the memory includes a plurality of banks, wherein the memory cycle is divided into a plurality of time slots, wherein each of the plurality of read requests is assigned to one of the plurality of time slots;

for each time slot in the memory cycle:

modifying a sorted list of banks based on the read request assigned to the time slot to produce a modified sorted list, wherein the modified sorted list indicates that the bank corresponding to the read request assigned to the time slot is ineligible for further memory operations in the time slot;

determining a first target bank for a first write operation corresponding to the time slot based on the modified sorted list; and incrementing a count value corresponding to the first target bank, wherein the count value corresponding to the first target bank indicates data storage level of the first target bank;

for each of the read requests, decrementing a count value for a bank to which the read request corresponds; and generating an updated sorted list of banks, wherein banks in the updated sorted list of banks are ordered based on corresponding data storage levels.

8. The method of claim 7, wherein the sequence of steps corresponding to each time slot in the memory cycle further comprises:

modifying the modified sorted list based on the first write operation to produce a further modified sorted list, wherein the further modified sorted list indicates that the first target bank is ineligible for additional memory operations during the time slot;

determining a second target bank for a second write operation from the further modified sorted list; and incrementing a count value corresponding to the second target bank, wherein the count value corresponding to the second target bank indicates data storage level of the second target bank.

9. The method of claim 7, wherein determining the first target bank further comprises selecting a first eligible bank from the modified sorted list.

10. The method of claim 9, wherein the memory cycle includes four time slots such that four read requests and eight write operations can be performed in a memory cycle.

11. The method of claim 10, wherein the memory cycle includes a fifth time slot for a memory refresh operation.

12. A balancing block for use with a memory that includes a plurality of banks, comprising:

a bank usage sorter, wherein the bank usage sorter produces an ordered list, wherein the ordered list includes representations corresponding to the plurality of banks, wherein the representations are ordered based on depth of each of the plurality of banks; and a bank assignment block operably coupled to the bank usage sorter, wherein the bank assignment block receives an indication of ineligible banks for a memory operation, wherein the bank selection block selects a first eligible bank from the ordered list for the memory operation.

13. The balancing block of claim 12 further comprises a plurality of bank assignment blocks operably coupled to the bank usage sorter, wherein each bank assignment block selects a selected bank for a corresponding memory operation to be performed in a time slot, wherein each bank assignment block corresponds to a different memory operation, wherein each bank assignment block receives an indication of ineligible banks for the corresponding memory operation, wherein the bank assignment block selects a first eligible bank from the ordered list for the corresponding memory operation.

14. The balancing block of claim 13, wherein the plurality of bank assignment blocks are grouped in pairs, wherein each pair corresponds to one time slot in a memory cycle, wherein a first block of each pair selects a first selected bank for a first write operation, wherein a second block of each pair selects a second selected bank for a second write operation, wherein the first block receives an indication of a read bank corresponding to a read operation for the one time slot, wherein the read bank is ineligible in selecting the first selected bank, wherein the second block receives the indication of the read bank and an indication of the first selected bank, wherein the read bank and the first selected bank are ineligible in selecting the second selected bank.

15. The balancing block of claim 13, wherein the indication of ineligible banks provided to each bank assignment block includes banks accessed in at least one adjacent time slot to the time slot for the corresponding memory operation for which the bank assignment block selects the selected bank.

16. The balancing block of claim 15, wherein each bank assignment block considers banks used in adjacent time slots and banks neighboring the banks used in adjacent time slots as ineligible banks for selection.

17. The balancing block of claim 12 further comprises a bank depth counter block operably coupled to the bank usage sorter and the bank assignment block, wherein the bank depth counter block monitors the depth of the each of the plurality of banks.

18. The balancing block of claim 17, wherein the bank depth counter block further comprises a plurality of counters, wherein each counter of the plurality of counters corresponds to a bank of the plurality of banks, wherein a counter is incremented when a write operation adds data to the bank corresponding to the counter, and wherein the counter is decremented when a read operation renders data in the bank obsolete.

19. The balancing block of claim 17 further comprises a controller operably coupled to the bank usage sorter, the bank assignment block, and the bank depth counter, wherein the controller provides control signals that control operation of the balancing block.

20. The balancing block of claim 19, wherein the controller is a finite state machine.

21. A bank balancing processor comprises:

a processing module; and instruction memory operably coupled to the processing module, wherein the instruction memory includes operating instructions that cause the processing module to:

modify, in response to a received read request, a sorted list of banks based on the read request to produce a modified sorted list, wherein the read request is for a current time slot, wherein the read request corresponds to a read bank of a buffer memory, wherein the buffer memory includes a plurality of banks, wherein the modified sorted list indicates that the read bank is ineligible for further memory operations in the current time slot;

determine a first target bank for a first write operation based on the modified sorted list;

increment a first count value corresponding to the first target bank, wherein the first count value indicates data storage level of the first target bank; and re-sort the sorted list of banks, wherein ordering of the banks in the sorted list corresponds to data storage levels of the banks.

22. The bank balancing processor of claim 21, wherein the instruction memory further comprises operating instructions that cause the processing module to, prior to performing the re-sort:

modify the modified sorted list based on the first write operation to produce a further modified sorted list, wherein the further modified sorted list indicates that the first target bank is ineligible for additional memory operations during the current time slot;

determine a second target bank for a second write operation from the further modified sorted list; and increment a second count value corresponding to the second target bank, wherein the second count value indicates data storage level of the second target bank.

23. The bank balancing processor of claim 22, wherein the instruction memory further comprises operating instructions that cause the processing module to, prior to performing the re-sort:

decrement a third count value corresponding to the read bank, wherein the third count value indicates data storage level of the read bank.

24. The bank balancing processor of claim 23, wherein the instruction memory further comprises operating instructions that cause the processing module to:

determine the first target bank by selecting a first eligible bank in the modified sorted list; and determine the second target bank by selecting a first eligible bank in the further modified sorted list.

25. The bank balancing processor of claim 24, wherein the processor is a finite state machine, and wherein the instruction memory is included in the circuitry of the finite state machine.

* * * * *